(12) United States Patent
Xu et al.

(10) Patent No.: US 9,571,090 B2
(45) Date of Patent: Feb. 14, 2017

(54) METHOD FOR COMPENSATING THIN FILM TRANSISTOR THRESHOLD VOLTAGE DRIFT

(71) Applicant: BOE TECHNOLOGY GROUP CO., LTD., Beijing (CN)

(72) Inventors: Chao Xu, Beijing (CN); Chunfang Zhang, Beijing (CN); Yan Wei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 151 days.

(21) Appl. No.: 14/671,507

(22) Filed: Mar. 27, 2015

(65) Prior Publication Data

US 2015/0207503 A1 Jul. 23, 2015

Related U.S. Application Data

(63) Continuation of application No. 14/127,849, filed as application No. PCT/CN2012/084341 on Nov. 8, 2012, now Pat. No. 9,014,327.

(30) Foreign Application Priority Data

May 31, 2012 (CN) .......................... 2012 1 0176588

(51) Int. Cl.
*G11C 19/00* (2006.01)
*H03K 17/30* (2006.01)
*G09G 3/36* (2006.01)
*G11C 19/28* (2006.01)

(52) U.S. Cl.
CPC .......... *H03K 17/302* (2013.01); *G09G 3/3648* (2013.01); *G09G 3/3674* (2013.01); *G09G 3/3677* (2013.01); *G09G 2300/043* (2013.01); *G09G 2310/0286* (2013.01); *G09G 2320/045* (2013.01); *G11C 19/28* (2013.01)

(58) Field of Classification Search
None
See application file for complete search history.

(56) References Cited

U.S. PATENT DOCUMENTS

| 3,862,435 A | 1/1975 | Salters et al. |
| 2007/0273426 A1 | 11/2007 | Cantatore |
| 2008/0024529 A1 | 1/2008 | Asano et al. |

(Continued)

FOREIGN PATENT DOCUMENTS

| CN | 1874627 A | 12/2006 |
| CN | 1892773 A | 1/2007 |
| CN | 102708824 A | 10/2012 |

OTHER PUBLICATIONS

International Search Report dated Feb. 28, 2013; PCT/CN2012/084341.

(Continued)

*Primary Examiner* — Tuan T Lam
(74) *Attorney, Agent, or Firm* — Ladas & Parry LLP

(57) ABSTRACT

A method for compensating a threshold voltage drift of a thin film transistor comprises: controlling a drain and a gate of the thin film transistor to have a same voltage; and keeping the voltage at the gate of the thin film transistor unchanged and controlling the voltage at the drain of the thin film transistor to be equal to a voltage at a source of the thin film transistor.

14 Claims, 12 Drawing Sheets

(56) References Cited

U.S. PATENT DOCUMENTS

| | | | |
|---|---|---|---|
| 2008/0030495 A1* | 2/2008 | Shirasaki | G09G 3/3233 345/214 |
| 2009/0219235 A1* | 9/2009 | Yamamoto | G09G 3/3233 345/80 |
| 2010/0073344 A1* | 3/2010 | Ohhashi | C23C 16/401 345/211 |
| 2011/0134107 A1 | 6/2011 | Lebrun et al. | |
| 2011/0273419 A1 | 11/2011 | Park et al. | |
| 2012/0326955 A1 | 12/2012 | Ohara | |
| 2013/0100173 A1 | 4/2013 | Chaji et al. | |
| 2013/0335307 A1 | 12/2013 | Guo et al. | |
| 2014/0061653 A1 | 3/2014 | Kim et al. | |
| 2014/0070725 A1 | 3/2014 | Qi et al. | |
| 2014/0152191 A1 | 6/2014 | Yang et al. | |
| 2014/0168127 A1* | 6/2014 | Yang | G06F 3/0416 345/173 |
| 2014/0306867 A1* | 10/2014 | Qing | G09G 3/3233 345/76 |

OTHER PUBLICATIONS

USPTO NOA mailed Dec. 23, 2014 in connection with U.S. Appl. No. 14/127,849.

* cited by examiner

Liquid crystal display panel

US 9,571,090 B2

METHOD FOR COMPENSATING THIN FILM TRANSISTOR THRESHOLD VOLTAGE DRIFT

This application is a continuation application of U.S. application Ser. No. 14/127,849 filed on Dec. 19, 2013 with the title of "Thin Film Transistor Threshold Voltage Offset Compensation Circuit, GOA Circuit, and Display".

TECHNICAL FIELD OF THE DISCLOSURE

The present disclosure relates to a technical filed of liquid crystal display, and particularly to a method for compensating a threshold voltage drift of a thin film transistor.

BACKGROUND

Thin Film Transistor is an electronic device commonly used in the technical field of manufacture of liquid crystal display. Similar to Field Effect Transistor, a normal turn-on condition of the thin film transistor is a voltage difference between a gate and a source being larger than a threshold voltage, that is, the thin film transistor is turned on only when the voltage difference between the gate and the source is larger than the threshold voltage, otherwise the thin film transistor cannot be turned on.

With the increase of operation time of a thin film transistor, the threshold voltage of the thin film transistor will change, that is, a threshold voltage drift phenomenon will occur. For example, in a common case, the threshold voltage of the thin film transistor is 15V, that is, when the voltage difference between the gate and the source is lower than 15V, the thin film transistor cannot be turned on to operate. However, when a threshold voltage drift of 1 V occurs, the thin film transistor can be turned on to operate normally only when the voltage difference between the gate and the source is not lower than 16V. It can be seen that the threshold voltage drift phenomenon of the thin film transistor has an effect on the normal turn-on of the thin film transistor and in turn on the operation of the thin film transistor such that the thin film transistor cannot operate normally in a circuit structure to achieve its function.

Thin Film Transistor Liquid Crystal Display (TFT-LCD) is a common liquid crystal display product. In the TFT-LCD, each pixel has a thin film transistor which is connected to a corresponding gate driving circuit so as to control variation of light transmission rate of the liquid crystal molecules in the pixel, such that a purpose of controlling the color variation of the pixel can be achieved. The GOA circuit technology is a gate driving circuit technology commonly used in the present TFT-LCD art, in the GOA circuit technology, the gate driving circuit is directly prepared on the array substrate, and thus the GOA circuit occupies a small space, has a simple preparation process, and has a good prospect in application.

The GOA circuit is a circuit corresponding to a row of pixels in the TFT-LCD and used for supplying a gate driving voltage for the thin film transistors in the corresponding row of pixels. The whole TFT-LCD has a plurality of rows of pixels and thus has a plurality of corresponding GOA circuit. FIG. 1 shows a schematic diagram of a liquid crystal panel including GOA circuits, wherein the GOA circuits are located at edges of the panel. During the operation of the TFT-LCD, each of rows of pixels is supplied with a gate driving voltage sequentially, and accordingly each of the GOA circuits corresponding to each of the rows of pixels starts to operate sequentially. FIG. 2 shows a schematic structural diagram of a GOA circuit corresponding to a certain row of pixels as shown in FIG. 1 (FIG. 2 is also a schematic structural diagram of the GOA circuit commonly used at present). It can be seen from FIG. 2 that the GOA circuit includes a plurality of thin film transistors and a capacitor, and the operation of the GOA circuit includes: a receiving terminal receives an input signal INPUT, and an output terminal outputs an output signal OUTPUT under the control of the individual thin film transistors, the capacitor and a clock signal.

With development of thin-film transistors industry and improvement of manufacturing process, the GOA technology has been applied to an increasing number of products, its advantages of reduced cost and simplified process have been respected by various major manufacturers, and the GOA technology has a high competitiveness in the market. However, there are some disadvantageous in the GOA technology: with increase in operation time, a phenomenon of threshold voltage drift will appear in the thin film transistors constituting the GOA circuit, which will cause deterioration of the stability of the thin film transistors and in turn affects the performance of the whole GOA circuit, especially when the thin film transistor for controlling a signal output terminal in the GOA circuit has a threshold voltage drift, the normal output of the GOA circuit will be seriously affected and the normal operation of the LCD display will be ultimately affected.

In the GOA circuit as shown in FIG. 2, the thin film transistor for controlling an output signal of the GOA circuit is an thin film transistor at the output terminal (as shown in the circle part in FIG. 2), which has a drain for receiving an output clock signal CLK. The threshold voltage drift data shown in FIG. 3 can be obtained by monitoring the thin film transistor at the output terminal under the room temperature (the temperature is 27° C.). It can be seen from FIG. 3 that the threshold voltage drift ΔVth (vertical axis) of the thin film transistor at the output terminal increases with the increase of the operation time (horizontal axis), which means that, with the increase of the operation time, if the turn-on voltage supplied to the thin film transistor at the output terminal is the normal turn-on voltage and keeps unchanged always, the thin film transistor at the output terminal will not be turned on after its threshold voltage drifts, and the whole GOA circuit in turn cannot output the output signal normally.

In summary, the threshold voltage drift phenomenon of the thin film transistor will seriously affect the normal turning-on of the thin film transistor, thereby affecting the normal operation of the circuit configuration including the thin film transistor; in the GOA circuit, the normal output of the whole GOA circuit will be directly affected if the thin film transistor for controlling the signal output has a threshold voltage drift.

SUMMARY

Embodiments of the present disclosure provide a method for compensating a threshold voltage drift of a thin film transistor, capable of solving the problem that the thin film transistor fails to be normally turned on due to its threshold voltage drift in the prior art.

One embodiment of the present disclosure provides a method for compensating a threshold voltage drift of a thin film transistor comprising: controlling a drain and a gate of the thin film transistor to have a same voltage; and keeping the voltage at the gate of the thin film transistor unchanged and controlling the voltage at the drain of the thin film transistor to be equal to a voltage at a source of the thin film transistor.

According to the method for compensating a threshold voltage drift of a thin film transistor, based on the principle that the voltage difference between the drain and the source of the thin film transistor is equal to the threshold voltage of the thin film transistor when the gate and the drain of the thin film transistor just have a same potential, the gate and the drain of the thin film transistor are firstly controlled to have the same potential by the first capacitor such that the voltage difference between the drain and the source of the thin film transistor is equal to the threshold voltage of the thin film transistor and the voltage difference between the gate and the source of the thin film transistor is equal to the threshold voltage of the thin film transistor, then voltage at the drain of the thin film transistor is controlled to reduce to a same level as the voltage at the source of the thin film transistor such that the voltage difference between the gate and the source of the thin film transistor is equal to the threshold voltage of the thin film transistor since the voltage at the gate of the thin film transistor does not change. It is ensured by such control procedure that the voltage difference between the gate and the source of the thin film transistor will be not lower than its threshold voltage even when the threshold voltage of the thin film transistor has a threshold voltage drift, such that the thin film transistor can be turned on under the control of the normal voltage supplied in the circuit in which the thin film transistor is located. That is to say, the thin film transistor can still be normally turned on after it has a threshold voltage drift.

According to the embodiments of the present disclosure, the thin film transistor at the output terminal of the GOA circuit is controlled by the compensation circuit for the threshold voltage drift of the thin film transistor of the embodiment of the present disclosure, such that the thin film transistor at the output terminal of the GOA circuit can be turned on normally even when it has the threshold voltage drift, which enhances the stability of the GOA circuit, thereby prolonging the life of the liquid crystal display.

DETAILED DESCRIPTION

Below, a compensation circuit for a threshold voltage drift of a thin film transistor and a GOA circuit, a display will be described in further detail with reference to embodiments of the present disclosure and the accompanying drawings.

Various switching units involved in the present disclosure may be any electric device with a switching control function in the prior art, such as semiconductor transistors, field effect transistors (FET), thin film transistors (TFT), etc. without limitation, as long as the purpose of solving the technical problem to be solved by the present disclosure can be achieved. In a particular implementation, when the various switching units adopt various electronic devices respectively, in order to achieve the purpose of the present disclosure, appropriate signals such as voltages, currents, etc. should be supplied accordingly.

Specifically, the compensation circuit for the threshold voltage drift of the thin film transistor according to the embodiment of the present disclosure is used for compensating the threshold voltage drift of the thin film transistor, the thin film transistors are mostly used in the liquid crystal display manufacturing field wherein the thin film transistor itself can use a transparent metal (such as ITO (Indium Tin Oxides)) and prepared by a lithography process, therefore the application of the thin film transistors may not affect the display of the display area in the liquid crystal display. When the compensation circuit for the threshold voltage drift of the thin film transistor according to the embodiment of the present disclosure is applied, the transparent metal and the lithography process may also be used to prepare various switching units in the compensation circuit as having the structure of the thin film transistor, such that the addition of the compensation circuit will not affect the display of the display area in the liquid crystal display.

Preferably, various switching units involved in the present disclosure are prepared as having the structure of the thin film transistor by using transparent metal and lithography process, and a source, a drain and a gate of each of the switching units may be determined according to the connection relationship of the switching unit in the compensation circuit for the threshold voltage drift of the thin film transistor according to the embodiments of the present disclosure.

The capacitance of various capacitors and the channel width to length ratio of various transistors involved in the embodiments of the present disclosure may be determined according to the particular situation.

Figure 4:
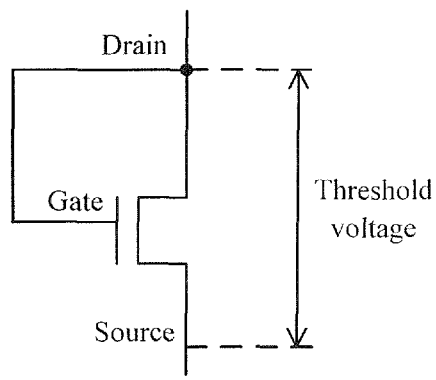
FIG. 4 is a schematic principle diagram showing that the voltage difference between a drain and a source of the thin film transistor is equal to the threshold voltage.

A core principle of the compensation circuit for threshold voltage drift according to the disclosure of the present disclosure may be represented in FIG. 4, specifically: When a drain and a gate of any of the thin film transistors have a same potential, the thin film transistor is equivalent to a diode, and a voltage difference between a source and the drain of the thin film transistor is exactly equal to the threshold voltage of the thin film transistor. Drain is prescribed as an upper electrode in the TFT symbol and source is prescribed as a lower electrode in the TFT symbol in the embodiments of the present disclosure to facilitate description, as shown in FIG. 4, although the source and the drain of the thin film transistor are symmetric in physical structure.

THE FIRST EMBODIMENT

Figure 5:
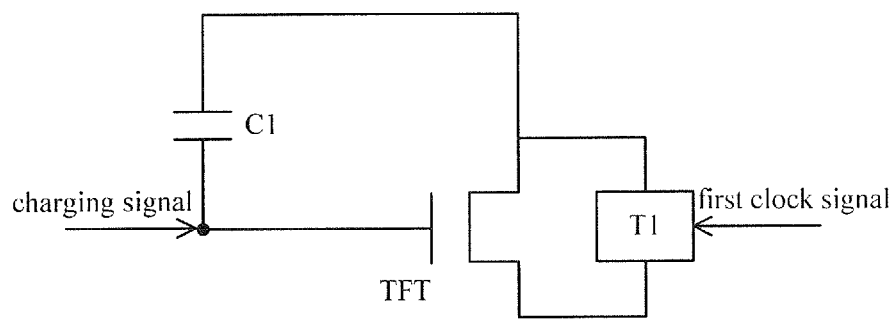
FIG. 5(a) is a schematic structural diagram of a compensation circuit for the threshold voltage drift of the thin film transistor provided in a first embodiment of the present disclosure.
FIG. 5(b) is a state of the compensation circuit for the threshold voltage drift of the thin film transistor provided in the first embodiment of the present disclosure under the control of a charging signal.
FIG. 5(c) is a state of the compensation circuit for the threshold voltage drift of the thin film transistor provided in the first embodiment of the present disclosure when a first clock signal is at an enable level.
Figure 5:
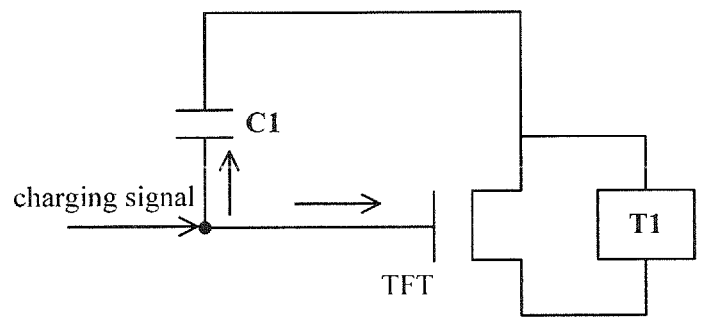
Figure 5:
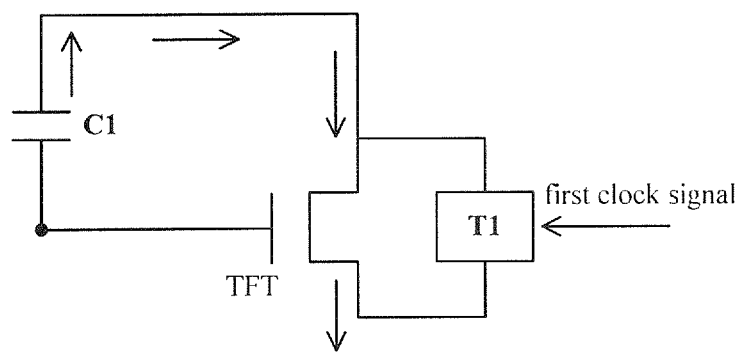

In order to control the voltage difference between a gate and a source of a thin film transistor equal to the threshold voltage of the thin film transistor, which ensures that the thin film transistor may be normally turned on even when it has a threshold voltage drift, the first embodiment of the present disclosure provides a compensation circuit for the threshold voltage drift of the thin film transistor. As shown in FIG. 5 (a), the compensation circuit comprises: a first capacitor C1, a first switching unit T1, a charging signal, a first clock signal.

The first capacitor C1 includes a first electrode and a second electrode, the first electrode is connected to a gate of the thin film transistor and receives the charging signal, the second electrode is connected to a drain of the thin film transistor; and the first capacitor C1 is used for ensuring the first electrode and the second electrode to have a same voltage under the control of the charging signal, such that a voltage difference between the drain and a source of the thin film transistor is equal to the threshold voltage of the thin film transistor.

The first switching unit T1 is connected to the drain and the source of the thin film transistor respectively, and is turned on under the control of the first clock signal, such that the voltage difference between the gate and the source of the thin film transistor is equal to the threshold voltage of the thin film transistor.

Wherein, the capacitance of the first capacitor is greater than the capacitance of the thin film transistor and the capacitance of the first switching unit by a set value.

In the present embodiment, the thin film transistor can be normally turned on when it has a threshold voltage drift, which means that the thin film transistor can still be normally turned on in the circuit where the thin film transistor is located (which is not the compensation circuit for the threshold voltage drift of the thin film transistor according to the embodiment of the present disclosure) with the aid of the compensation circuit for the threshold voltage drift of the thin film transistor according to the embodiment of the present disclosure, even if the thin film transistor has a threshold voltage drift.

It can be known from the description in the background section, the turn-on condition of the thin film transistor is the voltage difference between the gate and the source of the thin film transistor being larger than the threshold voltage. The compensation circuit for the threshold voltage drift of the thin film transistor as shown in FIG. 5(a) has a role of ensuring the voltage difference between the gate and the source of the thin film transistor equal to the threshold voltage, that is, creating a condition for the thin film transistor being turned on normally even when the threshold voltage drifts. On this basis, the voltage difference between the gate and the source of the thin film transistor will be larger than the threshold voltage thereof if the circuit where the thin film transistor is located still applies a gate voltage and a drain voltage to the gate and the drain of the thin film transistor respectively, which may cause that the turn-on condition of the thin film transistor is satisfied, thus the thin film transistor being turned on. Thus, the compensation circuit for the threshold voltage drift of the thin film transistor as shown in FIG. 5(a) only creates a condition for the thin film transistor being turned on normally when the threshold voltage drifts, and whether to turn on the thin film transistor or not is determined by the circuit itself where the thin film transistor is located.

In the present embodiment, said first clock signal begins to provide an enable function after the charging signal ends.

The operation principle and operation steps of the compensation circuit for the threshold voltage drift as shown in FIG. 5 (a) are as follows:

Step A, as shown in FIG. 5(b), firstly the charging signal appears, the first capacitor C1 is charged under the control of the charging signal, and the first electrode and the second electrode of the first capacitor C1 may have the same voltage when the charging signal ends (for the specific principles, please see below); meanwhile, the gate and the drain of the thin film transistor may have the same voltage since the first electrode is connected to the gate of the thin film transistor and the second electrode is connected to the drain of the thin film transistor; furthermore, it can be seen from the principle diagram as shown in FIG. 4 that the voltage difference between the drain and the source of said thin film transistor is exactly equal to the threshold voltage of the thin film transistor.

Assuming that the gate voltage of said thin film transistor is V1, the drain voltage thereof is V2, the source voltage thereof is V3, and the current threshold voltage of the thin film transistor is V0, the respective voltages have the following relationship at the end of step A: V1=V2, V1−V3=V2−V3=V0.

Step B, as shown in FIG. 5(c), when the charging signal ends, the first capacitor C1 begins to be discharged, meanwhile the first clock signal is at an enable level, the first switching unit T1 is turned on under the control of the first clock signal, so that the source and the drain of said thin film transistor are electrically connected and have the same voltage. That is, the drain voltage of the thin film transistor is reduced to a level equal to its source voltage when the first switching unit T1 is turned on. Furthermore, the voltage difference between the gate voltage and the source voltage of the thin film transistor is equal to the threshold voltage thereof at the end of step B, since the gate voltage of thin film transistor does not change and still keeps the voltage at the end of step A.

Still adopting the above assumptions, voltages at various electrodes of the thin film transistor has the following relationship at the end of Step B: V2=V3, V1−V2=V0.

In this embodiment, in the two steps A and B, in one aspect, the voltage difference between the gate and the source of the thin film transistor is forced to be equal to the threshold voltage thereof, that is, the threshold voltage of said thin film transistor is compensated, and the compensation circuit will ensure that the voltage difference between the gate and the source of the thin film transistor is equal to the current threshold voltage (i.e. the threshold voltage after a drift appears) thereof no matter how much the threshold voltage of the thin film transistor drifts, that is, the current threshold voltage of said thin film transistor is compensated; in another aspect, the thin film transistor in the present disclosure is an existing device in the circuit where the thin film transistor is located, and the gate and the drain of the thin film transistor still is under the control of the normal operation voltage.

Under the role of the above two aspects, that is, under the control of the compensated threshold voltage in the present disclosure and the normal operation voltage supplied in the circuit where the thin film transistor is located, the voltage difference between the gate and the source of the thin film transistor is greater than the threshold voltage thereof. It can be seen from the description in the background section that the thin film transistor can be turned on when the voltage difference between the gate and the source thereof is greater than the threshold voltage thereof, therefore the problem to be solved by the present disclosure is solved by the above two steps, that is, the thin film transistor can still be normally turned on even when it has a threshold voltage drift.

In the present embodiment, the first electrode and the second electrode of the first capacitor C1 have the same voltage under the control of the charging signal, the specific principle of which is as follows:

In the present embodiment, the first capacitor C1 have the following conditions:
1) the first electrode thereof receives the charging signal, that is, is connected to an excitation source; the second electrode is connected to the drain of the thin film transistor, that is, is not grounded and is not connected to another excitation source, therefore the first capacitor C1 is connected in the above compensation circuit in a coupling way (a capacitor being connected in a circuit in a coupling way means that one plate electrode is connected to an excitation source and another plate electrode is not grounded and not connected to another excitation source);

2) the capacitance of the first capacitor C1 is higher than the capacitance of the thin-film transistor and the capacitance of the first switching unit T1 by a set value (any electronic device has a capacitance), and the capacitance of the first capacitor C1 is far greater than the capacitance of the thin-film transistor and the capacitance of the first switching unit T1 when said set value is very large (in order to achieve the purpose of the present disclosure, the set value can be set to a large value).

In the field of electricity, when a capacitor is connected in a circuit in a coupling way, it has the following characteristics: when the electronic device connected to the capacitor has a relatively small capacitance as compared to the capacitance of the capacitor, the upper and lower plates of the capacitor will have the same voltage under the role of the excitation source.

Based on the above characteristics of a capacitor being connected in a circuit in a coupling way, the first electrode and the second electrode of the first capacitor C1 will have the same voltage when the first electrode receives the charging signal, since the above conditions 1) and 2) are satisfied.

In a particular implementation, since the thin film transistor has to complete its specific role in the circuit where the thin film transistor is located and since the first switching unit T1 has to complete its specific role in the compensation circuit provided in the embodiment of the present disclosure, both the thin film transistor and the first switching unit T1 inevitably have certain capacitances. Preferably, a capacitor having the capacitance far much larger than the capacitance of the thin film transistor and the capacitance of the first switching unit T1 may be selected as the first capacitor C1, so as to enable the first capacitor C1 to satisfy the above characteristics of a capacitor being connected in a circuit in a coupling way, such that the first electrode and the second electrode of the first capacitor C1 have the same voltage under the control of the charging signal.

In the present embodiment, the voltage difference between the gate and the source of the thin film transistor is controlled to be equal to the threshold voltage thereof, such that, in any case, even when the threshold voltage of the thin film transistor drifts, the voltage difference between the gate and the source of the thin film transistor will be not lower than the threshold voltage thereof. On this basis, the thin film transistor can be normally turned on when it is under the control of the normal operation voltage provided in the circuit where the thin film transistor is located. That is, the thin film transistor can be normally turned on after it has a threshold voltage drift.

The compensation circuit for the threshold voltage drift of the thin film transistor provided in the present disclosure can control the voltage difference between the gate and source of any thin film transistor equal to the threshold voltage thereof, that is, can function to compensate the threshold voltage of any thin film transistor, regardless whether the thin film transistor has a threshold voltage drift and what type of circuitry configuration the circuit where the thin film transistor is located has. Below the particular implementations of the compensation circuit for the threshold voltage drift of the thin film transistor according to the embodiment of the present disclosure will be illustrated in detail by taking the GOA circuit as an example.

It should be understood that the compensation circuit for the threshold voltage drift of the thin film transistor is applied into the GOA circuit in the following embodiments, but it is only for illustration and explanation of the present disclosure and not intended to limit the present invention, that is, the compensation circuit for the threshold voltage drift of the thin film transistor according to the embodiment of the present disclosure can act on any circuitry configuration including the thin film transistor.

In the following embodiments, the GOA circuit is a circuit for supplying the gate driving voltage to the corresponding row of pixels, the GOA circuits corresponding to the respective rows of pixels should periodically operate according to a set rule so as to meet the color variation requirement of the respective rows of pixels in the liquid crystal display. In the following embodiments, each operating cycle of the GOA circuit begins from receiving an input signal and ends at outputting an output signal.

In the following embodiments, the thin film transistor at the output terminal is an existing device in the GOA circuit and is used for controlling whether the output terminal of the GOA circuit outputs a signal. Taking the GOA circuit shown in FIG. 2 as an example, the output terminal of the GOA circuit outputs a signal OUTPUT when the thin film transistor at the output terminal is turned on, and there is no signal outputted at the output terminal of the GOA circuit when the thin film transistor at the output terminal is turned off.

In the following embodiments, the expression of "the clock signal is at an enable level" means that the clock signal is in a state having the enable level; the expression "the plurality of clock signals are at an enable level sequentially" means that the alternating appearance of a clock signal being at an enable level and next clock signal being at the enable level. In addition, in the following embodiments, the enable level is a level value when the clock signal plays an enabling role, and the specific level value of the enable level of each of the respective clock signals is not defined in the present disclosure as long as it may play the enabling role. Therefore, in the following embodiments, the level values of the enable levels of the respective clock signals may be same or different.

It should be noted that, for a high-resolution TFT-LCD display device, in order that each row of pixels can complete the color variation quickly, the operating frequency of the GOA circuits for supplying a gate driving voltage to each row of pixels will be very high, and the operating cycle thereof will be very short accordingly, usually on the order of milliseconds (ms). Therefore, in order to achieve the purpose of compensating the threshold voltage of the thin film transistor at the output terminal of the GOA circuit, the frequency of the charging signal and the respective clock signals involved in the following embodiments will also need to be very high, usually on the order of KHz~MHz.

THE SECOND EMBODIMENT

Figure 6:
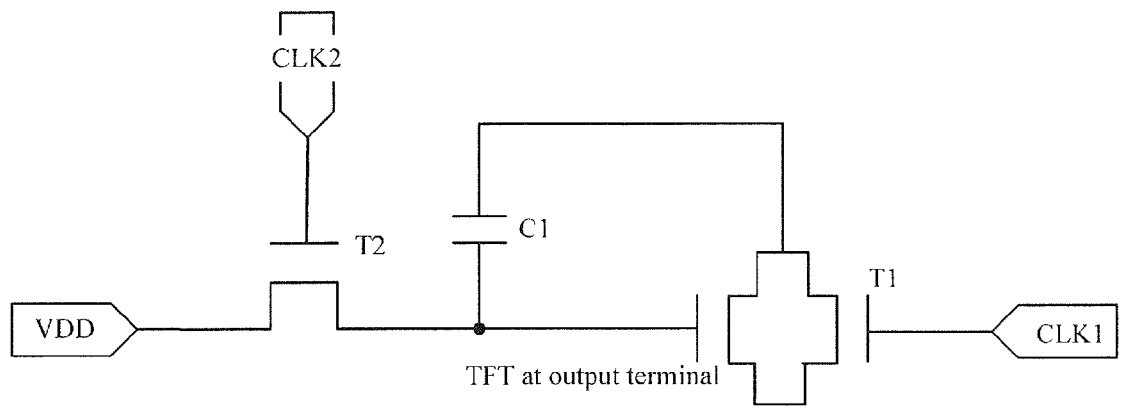
FIG. 6(a) is a schematic structural diagram of a compensation circuit for the threshold voltage drift of the thin film transistor provided in a second embodiment of the present disclosure.
FIG. 6(b) is a timing sequence diagram of respective clock signals involved in the second embodiment of the present disclosure.
FIG. 6(c) is a state of the compensation circuit for the threshold voltage drift of the thin film transistor provided in the second embodiment of the present disclosure when a second clock signal CLK2 is at an enable level.
FIG. 6(d) is a state of the compensation circuit for the threshold voltage drift of the thin film transistor provided in the second embodiment of the present disclosure when a first clock signal CLK1 is at an enable level.
Figure 6:
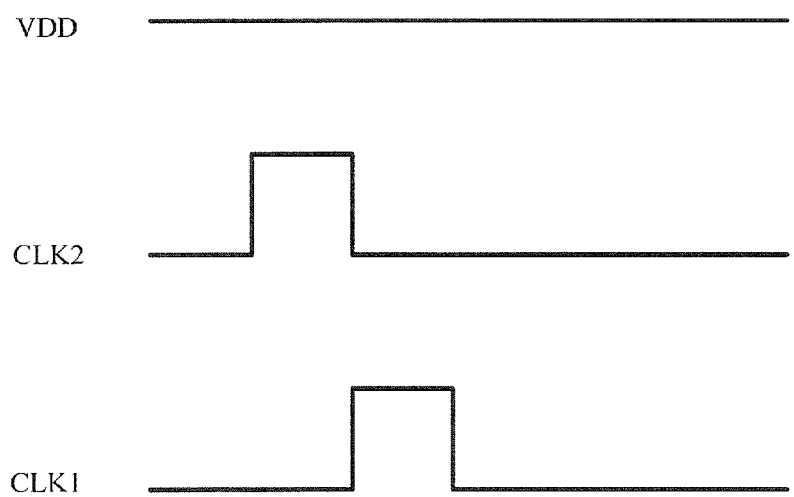
Figure 6:
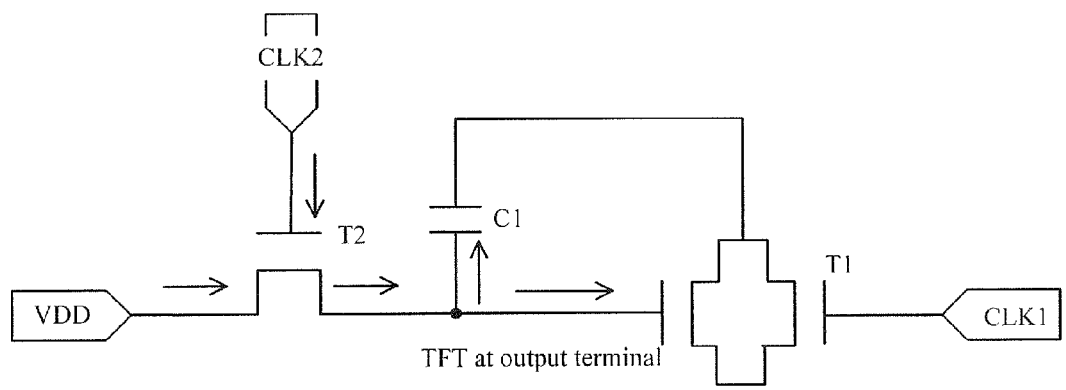
Figure 6:
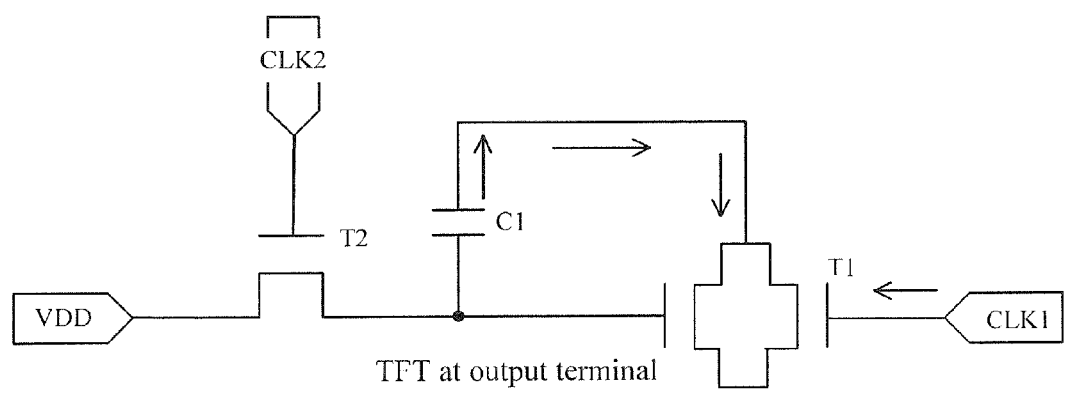

The second embodiment of the present disclosure provides a compensation circuit for the threshold voltage drift of the thin film transistor, which makes the voltage difference between a gate and a source of the thin film transistor at the output terminal of the GOA circuit equal to the threshold voltage thereof, such that the thin film transistor at the output terminal may be normally turned on even when it has a threshold voltage drift. As shown in FIG. 6(a), the compensation circuit comprises: a first capacitor C1, a first switching unit T1, a second switching unit T2, a first clock signal CLK1 and a second clock signal CLK2, wherein both the first switching unit T1 and the second switching unit T2 are thin film transistors.

The first capacitor C1 includes a first electrode and a second electrode, the first electrode is connected to a gate of the thin film transistor at the output terminal and the second electrode is connected to a drain of the thin film transistor at the output terminal.

The first switching unit T1 has a drain connected to the drain of the thin film transistor at the output terminal, a source connected to the source of the thin film transistor at the output terminal, and a gate for receiving the first clock signal CLK1.

The second switching unit T2 has a drain for receiving a drain voltage VDD, a source connected to the first electrode, and a gate connected to the second clock signal CLK2.

The timing sequence diagram for the drain voltage VDD, the first clock signal CLK1 and the second clock signal CLK2 in the present embodiment is shown in FIG. 6(b), the drain voltage VDD is always at a high level, the second clock signal and the first clock signal are at an enable level sequentially or alternately, and the first clock signal being at the enable level for a prescribed period appears in each operating cycle of the GOA circuit.

The workflow of the compensation circuit for the threshold voltage drift of the thin film transistor provided in the present embodiment is shown in FIG. 6(c) and FIG. 6(d), particularly:

Step 601, as shown in FIG. 6(c), the second clock signal CLK2 is at an enable level, the second switching unit T2 is turned on under the control of the second clock signal CLK2 and the drain voltage VDD (that is, the voltage difference between the enable level of the second clock signal CLK2 and the high level of the drain voltage VDD is greater than the threshold voltage of the second switching unit T2), a current flows in the direction of the arrow shown in FIG. 6(c) to provide a charging signal to the first capacitor C1, the first electrode and the second electrode of the first capacitor C1 will have the same voltage after the enabling of the second clock signal CLK2 ends; the gate and the drain of the thin film transistor at the output terminal will also have the same voltage since the first electrode is connected to the gate of the thin film transistor at the output terminal and the second electrode is connected to the drain of the thin film transistor at the output terminal. Furthermore, it can be seen from FIG. 4 that the voltage difference between the drain and the source of the thin film transistor at the output terminal is exactly equal to the threshold voltage of the thin film transistor at the output terminal.

Step 602, as shown in FIG. 6(d), the first clock signal CLK1 is at an enable level and the enabling of the second clock signal CLK2 ends, the first capacitor C1 is no longer supplied with the charging signal and begins to be discharged, a current flows in the direction of the arrow shown in FIG. 6(d) to provide a drain voltage to the drain of the first switching unit T1, and the first switching unit T1 is turned on under the control of the first clock signal CLK1 and the drain voltage (that is, the voltage difference between the enable level of the first clock signal CLK1 and the source voltage is greater than the threshold voltage of the first switching unit T1), such that the drain and the source of the thin film transistor at the output terminal are electrically connected and thus have the same voltage. That is, the drain voltage of the thin film transistor at the output terminal is reduced to a level equal to the source voltage thereof through the turning-on of first switching unit T1. Furthermore, since the gate voltage of the thin film transistor at the output terminal does not change and still keeps the voltage at the end of step 601, the voltage difference between the gate and the source of the thin film transistor at the output terminal is equal to the threshold voltage thereof at the end of step 602.

Through the above two steps, the voltage difference between the gate and the source of the thin film transistor at the output terminal is equal to the threshold voltage thereof, that is, the threshold voltage of the thin film transistor at the output terminal is compensated. On this basis, no matter whether the thin film transistor at the output terminal has a threshold voltage drift and no matter how much the drift is, the thin film transistor at the output terminal can satisfy the turn-on condition and can be turned on when the gate and the drain of the thin film transistor at the output terminal receive the normal gate voltage and the normal drain voltage provided in the GOA circuit. Therefore, the present embodiment achieves the purpose of compensating the threshold voltage and solves the technical problem to be solved in the present disclosure, that is, the thin film transistor at the output terminal of the GOA circuit can be turned on normally even when it has a threshold voltage drift.

It should be noted that, in the present embodiment, the first clock signal being at an enable level for a prescribed period has to appear in each operating cycle of the GOA circuit, this is mainly because the step for making the voltage difference between the gate and the source of the thin film transistor at the output terminal equal to the threshold voltage thereof has to be performed so as to achieve the purpose the thin film transistor at the output terminal may be turned on in the operating cycle of the GOA circuit, and the step is directly implemented by the turning-on of the first switching unit T1. Furthermore, the turn-on of the first switching unit T1 is caused by the first clock signal being a enabling level. Therefore, the first clock signal being a enabling level must appear within every operation cycle of the GOA circuit.

The compensation circuit for the threshold voltage drift of the thin film transistor provided in the embodiment of the present disclosure can compensate the threshold voltage of the thin film transistor at the output terminal of the GOA circuit in real time, such that the thin film transistor at the output terminal of the GOA circuit can be turned on normally even when it has the threshold voltage drift, which enhances the stability of the GOA circuit, thereby prolonging the life of the liquid crystal display.

THE THIRD EMBODIMENT

Figure 7:
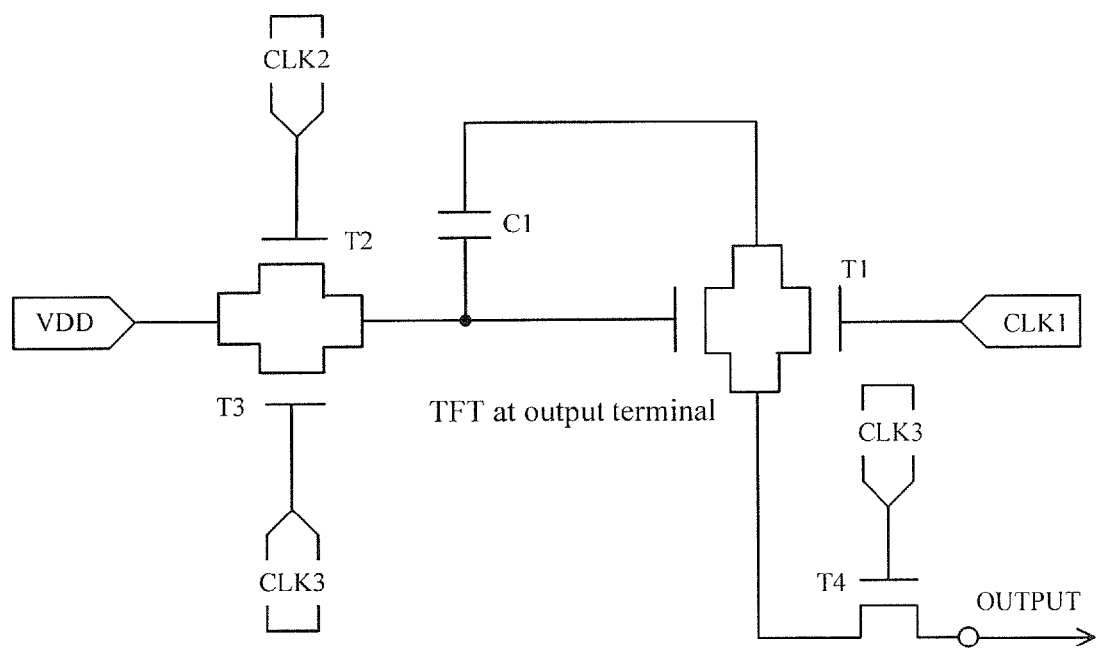
FIG. 7(a) is a schematic structural diagram of a compensation circuit for the threshold voltage drift of the thin film transistor provided in a third embodiment of the present disclosure.
FIG. 7(b) is a timing sequence diagram of respective clock signals involved in the third embodiment of the present disclosure.
FIG. 7(c) is a state of the compensation circuit for the threshold voltage drift of the thin film transistor provided in the third embodiment of the present disclosure when a third clock signal CLK3 is at an enable level.
Figure 7:
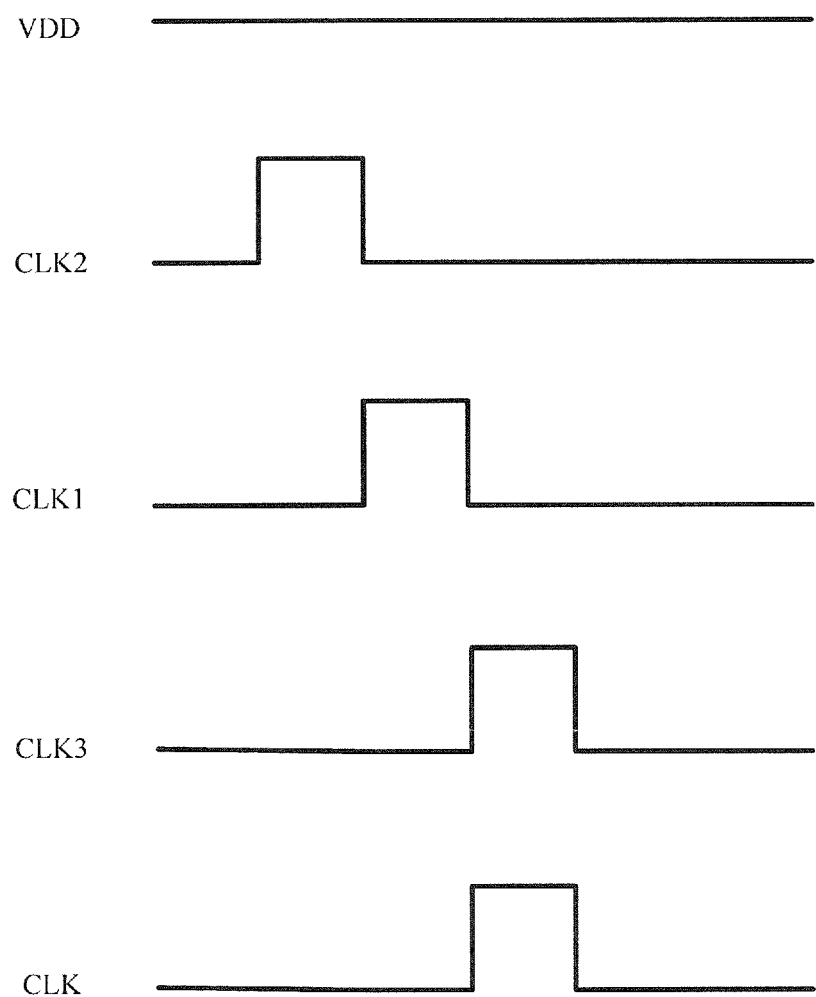
Figure 7:
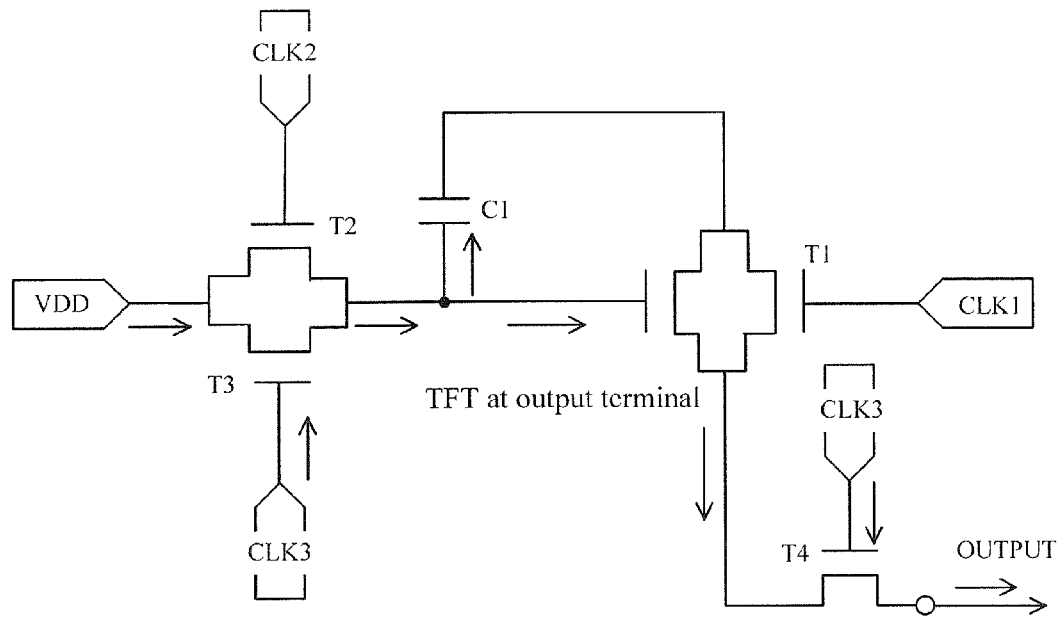

In the third embodiment of the present disclosure, there is provided a compensation circuit for the threshold voltage drift of the thin film transistor, which not only makes the voltage difference between a gate and a source of the thin film transistor at the output terminal of the GOA circuit equal to the threshold voltage thereof, but also supplies corresponding gate voltage and drain voltage to the thin film transistor at the output terminal so as to control the turning-on of the thin film transistor at the output terminal to be implemented and in turn control the output terminal of the GOA circuit to output a signal, as compared to the compensation circuit for the threshold voltage drift of the thin film transistor as provided in the second embodiment. As shown in FIG. 7(a), the compensation circuit for the threshold voltage drift of the thin film transistor comprises: a first capacitor C1, a first switching unit T1, a second switching unit T2, a third switching unit T3, a fourth switching unit T4, a first clock signal CLK1, a second clock signal CLK2 and a third clock signal CLK3, wherein all of the first switching unit T1, the second switching unit T2, the third switching unit T3 and the fourth switching unit T4 are thin film transistors.

The first capacitor C1 includes a first electrode and a second electrode, the first electrode is connected to a gate of the thin film transistor at the output terminal and the second electrode is connected to a drain of the thin film transistor at the output terminal.

The first switching unit T1 has a drain connected to the drain of the thin film transistor at the output terminal, a source connected to the source of the thin film transistor at the output terminal, and a gate for receiving the first clock signal CLK1.

The second switching unit T2 has a drain for receiving a drain voltage VDD, a source connected to the first electrode, and a gate connected to the second clock signal CLK2.

The third switching unit T3 has a drain for receiving a drain voltage VDD, a source connected to the gate of the thin film transistor at the output terminal, and a gate for receiving the third clock signal CLK3.

The fourth switching unit T4 has a drain connected to the source of the thin film transistor at the output terminal, a source connected to the output terminal of the GOA circuit and a gate connected to the third clock signal CLK3.

The timing sequence diagram for the drain voltage VDD, the first clock signal CLK1, the second clock signal CLK2 and the third clock signal CLK3 in the present embodiment is shown in FIG. 7(b), the drain voltage VDD is always at a high level, the second clock signal CLK2, the first clock signal CLK1 and the third clock signal CLK3 are at an enable level sequentially or alternately, and the first clock signal being at an enable level for a prescribed period and the third clock signal being at an enable level for a prescribed period appears in each operating cycle of the GOA circuit.

The workflow of the compensation circuit for the threshold voltage drift of the thin film transistor provided in the present embodiment is as follows:

Step 701, the second clock signal CLK2 is at an enable level, the second switching unit T2 is turned on under the control of the second clock signal CLK2 and the drain voltage VDD (that is, the voltage difference between the enable level of the second clock signal CLK2 and the high level of the drain voltage VDD is greater than the threshold voltage of the second switching unit T2) and provides a charging signal to the first capacitor C1, the first electrode and the second electrode of the first capacitor C1 will have the same voltage after the enabling of the second clock signal CLK2 ends; the gate and the drain of the thin film transistor at the output terminal will also have the same voltage since the first electrode is connected to the gate of the thin film transistor at the output terminal and the second electrode is connected to the drain of the thin film transistor at the output terminal. Furthermore, it can be seen from the principle diagram as shown in FIG. 4 that the voltage difference between the drain and the source of the thin film transistor at the output terminal is exactly equal to the threshold voltage of the thin film transistor at the output terminal.

Step 702, the first clock signal CLK1 is at an enable level and the enabling of the second clock signal CLK2 ends, the first capacitor C1 is no longer supplied with the charging signal and begins to be discharged, such process provides a drain voltage to the drain of the first switching unit T1, and the first switching unit T1 is turned on under the control of the first clock signal CLK1 and the drain voltage (that is, the voltage difference between the enable level of the first clock signal CLK1 and the source voltage is greater than the threshold voltage of the first switching unit T1), such that the drain and the source of the thin film transistor at the output terminal are electrically connected and thus have the same voltage. That is, the drain voltage of the thin film transistor at the output terminal is reduced to a level equal to the source voltage thereof through the turning-on of first switching unit T1. Furthermore, since the gate voltage of the thin film transistor at the output terminal does not change and still keeps the voltage at the end of step 701, the voltage difference between the gate and the source of the thin film transistor at the output terminal is equal to the threshold voltage thereof at the end of step 702.

Step 703, as shown in FIG. 7(c), the third clock signal CLK3 is at an enable level, the third switching unit T3 is turned on under the control of the third clock signal CLK3 and the drain voltage VDD (that is, the voltage difference between the enable level of the third clock signal CLK3 and the high level of the drain voltage VDD is greater than the threshold voltage of the third switching unit T3), currents flows in the direction of the arrows shown in FIG. 7(c) to the gate of the thin film transistor at the output terminal and the first capacitor C1, the first capacitor C1 blocks the current but can transmit the voltage (to the drain of the thin film transistor at the output terminal) in this process, therefore the gate and the drain of the thin film transistor at the output terminal will be supplied with corresponding gate voltage and drain voltage through the turning-on of the third switching unit T3. In addition, since the voltage difference between the gate and the source of the thin film transistor at the output terminal has already be equal to the threshold voltage thereof at the end of step 702, the voltage difference between the gate and the source of the thin film transistor at the output terminal will be greater than the threshold voltage thereof under the common role of the gate voltage and the drain voltage supplied by the third switching unit T3 and the existing voltage difference between the gate and the source of the thin film transistor at the output terminal obtained at the end of step 702, which satisfies the turning-on condition of the thin film transistor at the output terminal, thereby the thin film transistor at the output terminal being turned on. A current flows to the drain of the fourth switching unit T4 after the turning-on of the thin film transistor at the output terminal, such that the fourth switching unit T4 is supplied with a drain voltage, meanwhile the gate of the fourth switching unit T4 receives the third clock signal which is at an enable level (equivalent to that a gate voltage is supplied), so the fourth switching unit T4 is turned on under the control of the third clock signal CLK3 and its drain voltage (that is, the voltage difference between the enable level of the third clock signal CLK3 and the source voltage is greater than the threshold voltage of the fourth switching unit T4), and a current flows to the output terminal of the GOA circuit and the GOA circuit outputs a signal OUTPUT.

The signal output from the GOA circuit is used to provide a gate driving voltage for a corresponding row of pixels in the display. In order to satisfy the requirement of the corresponding row of pixels on the display, the GOA circuit is required to output the signal timely, that is, the GOA circuits have to output signals according to a certain timing sequence so as to satisfy the requirements of the display. In the existing GOA circuit, the timing sequence is usually controlled by an output clock signal CLK (as shown in FIG. 7(b)), and hereinafter is referred to as an output timing sequence of the GOA circuit. In step 703, the timing sequence of the third clock signal CLK3 can be set to be consistent with the output timing sequence of the GOA circuit, such that the ultimate output signal may satisfy the requirement of the corresponding row of pixels on the display, that is, the compensation circuit for the threshold voltage drift provided in the present embodiment can achieve the function of assisting the GOA circuit to output the signal.

In the present embodiment, when the third switching unit T3 is turned on and supplies the gate voltage and the drain voltage to the thin film transistor at the output terminal, the voltage difference between the gate and the source of the thin film transistor at the output terminal will further increase on the basis of the compensated threshold voltage, such that the thin film transistor at the output terminal can satisfy the turning-on condition thereof and can thus be turned on. Therefore, the present embodiment not only solves the technical problem to be solved in the present disclosure (that is, the thin film transistor at the output terminal can be normally turned on even when it has a threshold voltage drift), but also has the function of controlling the GOA circuit to output the signal.

Similar to the first clock signal being at an enable level for a prescribed period has to appear in each operating cycle of the GOA circuit, the third clock signal CLK3 for controlling the third switching unit T3 and the fourth switching unit T4 has to be at an enable level for a prescribed period in each operating cycle of the GOA circuit, since the turning-on of the third switching unit T3 and the fourth switching unit T4 will have a direct influence on the output signal of the GOA circuit.

THE FOURTH EMBODIMENT

In the fourth embodiment of the present disclosure, there is provided a compensation circuit for a threshold voltage shift of a thin film transistor. Similar to the third embodiment, the compensation circuit for the threshold voltage drift of the thin film transistor provided in the fourth embodiment not only makes the voltage difference between a gate and a source of the thin film transistor at the output terminal of the GOA circuit equal to the threshold voltage thereof, but also supplies corresponding gate voltage and drain voltage to the thin film transistor at the output terminal so as to control the turning-on of the thin film transistor at the output terminal to be implemented and in turn control the output terminal of the GOA circuit to output a signal. In addition, as compared to the third embodiment, the compensation circuit for the threshold voltage drift of the thin film transistor as provided in the present embodiment can also control the output terminal of the GOA circuit implementing the function of delaying the output signal according to the actual requirement of the GOA circuit.

As shown in FIG. 8(a), the compensation circuit for the threshold voltage drift of the thin film transistor provided in the embodiment of the present disclosure comprises: a first capacitor C1, a first switching unit T1, a second switching unit T2, a third switching unit T3, a fourth switching unit T4, a second capacitor C2, a fifth switching unit T5, a first clock signal CLK1, a second clock signal CLK2, a third clock signal CLK3 and a fourth clock signal CLK4, wherein all of the first switching unit T1, the second switching unit T2, the third switching unit T3, the fourth switching unit T4 and the fifth switching unit T5 have the structure of thin film transistors.

The first capacitor C1 includes a first electrode and a second electrode, the first electrode is connected to a gate of the thin film transistor at the output terminal and the second electrode is connected to a drain of the thin film transistor at the output terminal.

The first switching unit T1 has a drain connected to the drain of the thin film transistor at the output terminal, a source connected to the source of the thin film transistor at the output terminal, and a gate for receiving the first clock signal CLK1.

The second switching unit T2 has a drain for receiving a drain voltage VDD, a source connected to the first electrode, and a gate connected to the second clock signal CLK2.

The third switching unit T3 has a drain for receiving a drain voltage VDD, a source connected to the gate of the thin film transistor at the output terminal, and a gate for receiving the third clock signal CLK3.

The second capacitor C2 includes a third electrode and a fourth electrode, the third electrode is connected to the source of the fourth switching unit T4 and the drain of the fifth switching unit T5, respectively, and the fourth electrode is grounded.

The fourth switching unit T4 has a drain connected to the source of the thin film transistor at the output terminal, a source connected to the third electrode and a gate for receiving the third clock signal CLK3.

The fifth switching unit T5 has a drain connected to the third electrode, a source connected to the output terminal of the GOA circuit, and a gate for receiving the fourth clock signal CLK4.

The timing sequence diagram for the drain voltage VDD, the first clock signal CLK1, the second clock signal CLK2, the third clock signal CLK3 and the fourth clock signal CLK4 in the present embodiment is shown in FIG. 8(b), the drain voltage VDD is always at a high level, the second clock signal CLK2, the first clock signal CLK1, the third clock signal CLK3 and the fourth clock signal CLK4 are at an enable level sequentially or alternately, and the first clock signal CLK1 being at an enable level for a prescribed period, the third clock signal CLK3 being at an enable level for a prescribed period and the fourth clock signal CLK4 being at an enable level for a prescribed period appear in each operating cycle of the GOA circuit.

The workflow of the compensation circuit for the threshold voltage drift of the thin film transistor provided in the present embodiment is as follows:

Step 801, the second clock signal CLK2 is at an enable level, the second switching unit T2 is turned on under the control of the second clock signal CLK2 and the drain voltage VDD (that is, the voltage difference between the enable level of the second clock signal CLK2 and the high level of the drain voltage VDD is greater than the threshold voltage of the second switching unit T2) and provides a charging signal to the first capacitor C1, the first electrode and the second electrode of the first capacitor C1 will have the same voltage after the enabling of the second clock signal CLK2 ends; the gate and the drain of the thin film transistor at the output terminal will also have the same voltage since the first electrode is connected to the gate of the thin film transistor at the output terminal and the second electrode is connected to the drain of the thin film transistor at the output terminal. Furthermore, it can be seen from the principle diagram as shown in FIG. 4 that the voltage difference between the drain and the source of the thin film transistor at the output terminal is exactly equal to the threshold voltage of the thin film transistor at the output terminal.

Step 802, the first clock signal CLK1 is at an enable level and the enabling of the second clock signal CLK2 ends, the first capacitor C1 is no longer supplied with the charging signal and begins to be discharged, such process provides a drain voltage to the drain of the first switching unit T1, and the first switching unit T1 is turned on under the control of the first clock signal CLK1 and the drain voltage (that is, the voltage difference between the enable level of the first clock signal CLK1 and the drain voltage is greater than the threshold voltage of the first switching unit T1), such that the drain and the source of the thin film transistor at the output terminal are electrically connected and thus have the same voltage. That is, the drain voltage of the thin film transistor at the output terminal is reduced to a level equal to the source voltage thereof through the turning-on of first switching unit T1. Furthermore, since the gate voltage of the thin film transistor at the output terminal does not change and still keeps the voltage at the end of step 801, the voltage difference between the gate and the source of the thin film transistor at the output terminal is equal to the threshold voltage thereof at the end of step 802.

Step 803, as shown in FIG. 8(c), the third clock signal CLK3 is at an enable level, the third switching unit T3 is turned on under the control of the third clock signal CLK3 and the drain voltage VDD (that is, the voltage difference between the enable level of the third clock signal CLK3 and the high level of the drain voltage VDD is greater than the threshold voltage of the third switching unit T3), currents flows in the direction of the arrows shown in FIG. 8(c) to the gate of the thin film transistor at the output terminal and the first capacitor C1, the first capacitor C1 blocks the current but can transmit the voltage (to the drain of the thin film transistor at the output terminal) in this process, therefore the gate and the drain of the thin film transistor at the output terminal will be supplied with corresponding gate voltage and drain voltage through the turning-on of the third switching unit T3. In addition, since the voltage difference between the gate and the source of the thin film transistor at the output terminal has already been equal to the threshold voltage thereof at the end of step 802, the voltage difference between the gate and the source of the thin film transistor at the output terminal will be greater than the threshold voltage thereof under the common role of the gate voltage and the drain voltage supplied by the third switching unit T3 and the existing voltage difference between the gate and the source of the thin film transistor at the output terminal obtained at the end of step 802, which satisfies the turning-on condition of the thin film transistor at the output terminal, thereby the thin film transistor at the output terminal being turned on. A current flows to the drain of the fourth switching unit T4 after the turning-on of the thin film transistor at the output terminal, such that the fourth switching unit T4 is supplied with a drain voltage, meanwhile the gate of the fourth switching unit T4 receives the third clock signal which is at an enable level (equivalent to that a gate voltage is supplied), so the fourth switching unit T4 is turned on under the control of the third clock signal CLK3 and its drain voltage (that is, the voltage difference between the enable level of the third clock signal CLK3 and the source voltage is greater than the threshold voltage of the fourth switching unit T4), and a current flows to the second capacitor C2 to charge the second capacitor C2 to a saturation state after the fourth switching unit T4 is turned on.

Figure 8:
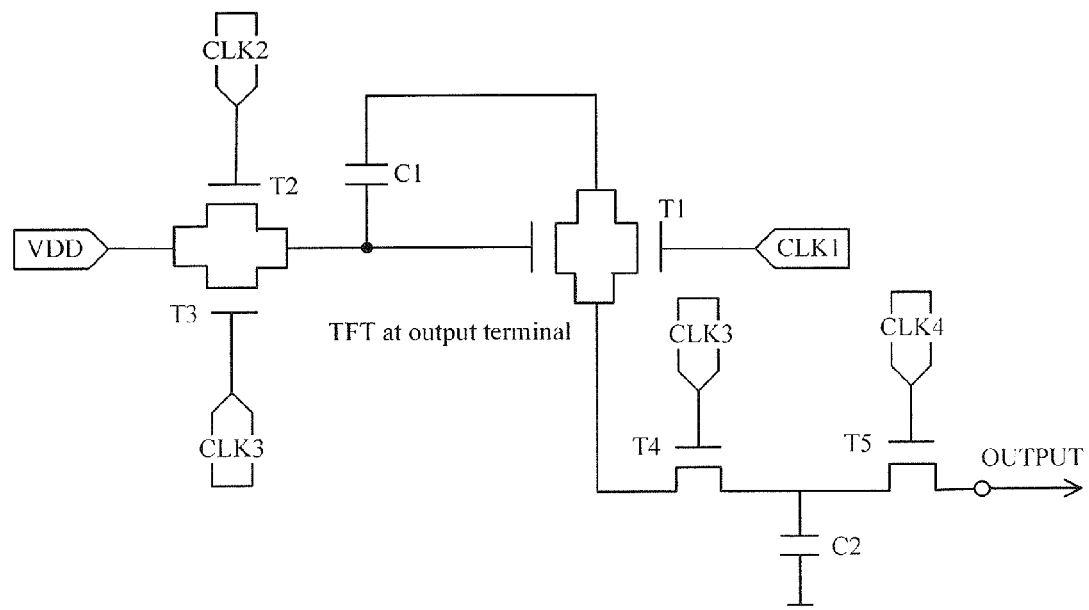
FIG. 8(a) is a schematic structural diagram of a compensation circuit for the threshold voltage drift of the thin film transistor provided in a fourth embodiment of the present disclosure.
FIG. 8(b) is a timing sequence diagram of respective clock signals involved in the fourth embodiment of the present disclosure.
FIG. 8(c) is a state of the compensation circuit for the threshold voltage drift of the thin film transistor provided in the fourth embodiment of the present disclosure when a third clock signal CLK3 is at an enable level.
FIG. 8(d) is a state of the compensation circuit for the threshold voltage drift of the thin film transistor provided in the fourth embodiment of the present disclosure when a fourth clock signal CLK4 is at an enable level.
Figure 8:
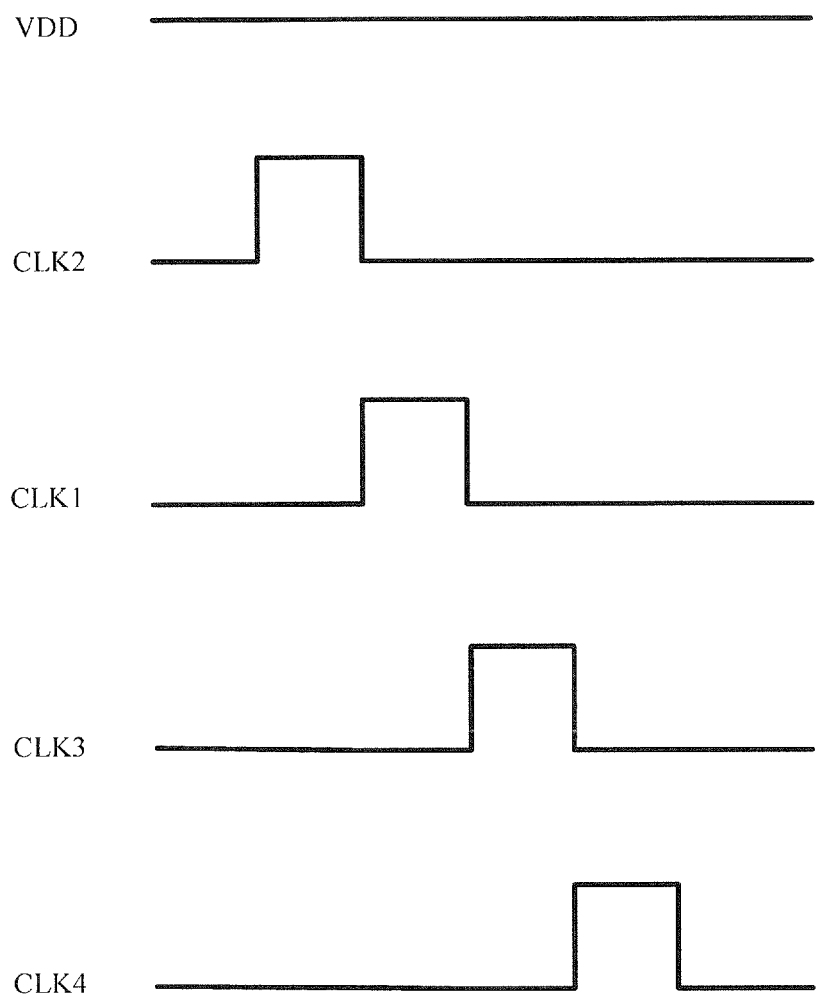
Figure 8:
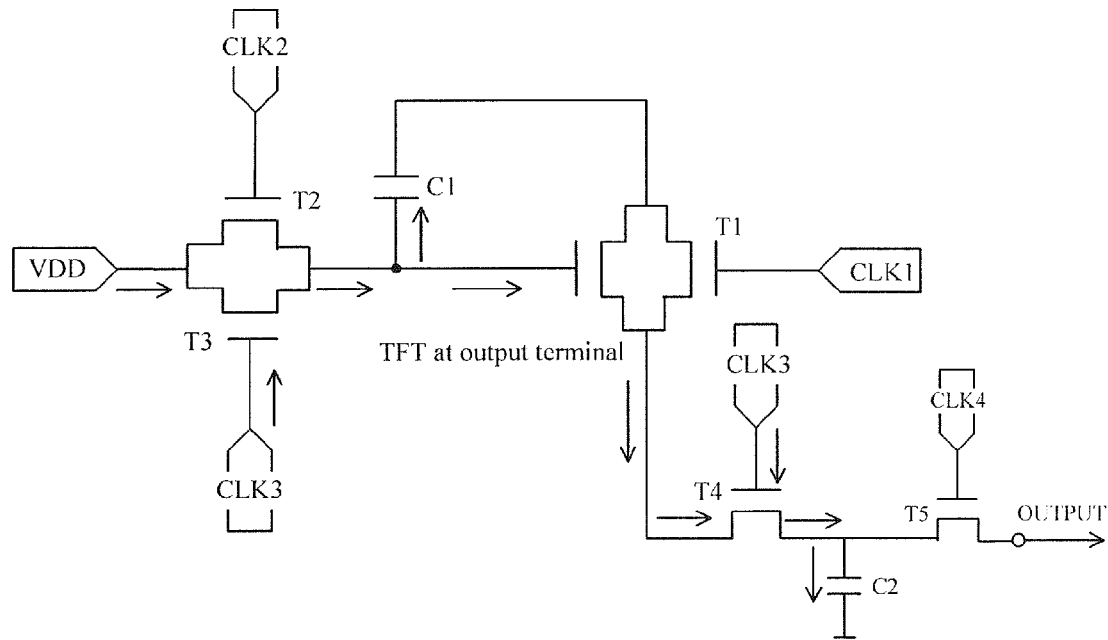
Figure 8:
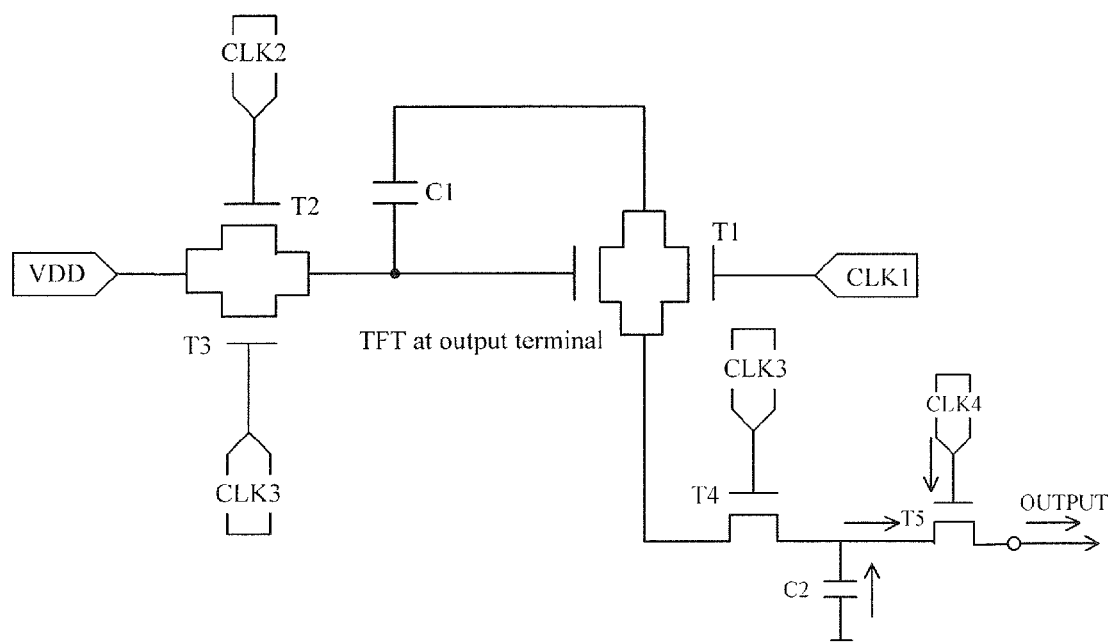

Step 804, as shown in FIG. 8 (d), the fourth clock signal CLK4 is at an enable level and the enabling of the third clock signal CLK3 ends, the second capacitor C2 is no longer supplied with the charging signal and begins to be discharged, such process provides a drain voltage to the drain of the fifth switching unit T5, and the fifth switching unit T5 is turned on under the control of the fourth clock signal CLK4 and the drain voltage (that is, the voltage difference between the enable level of the fourth clock signal CLK4 and the source voltage is greater than the threshold voltage of the fifth switching unit T5), such that a current flows to the output terminal of the GOA circuit and the GOA circuit outputs a signal OUTPUT.

In the present embodiment, the third switching unit T3 and the fourth switching unit T4 are turned on when the third clock signal is at an enable level, no current can flow to the output terminal of the GOA circuit and thus no signal is output at the output terminal of the GOA circuit since the fifth switching unit T5 is not turned on, instead the second capacitors C2 stores charges at this stage; then when the fourth clock signal CLK4 is at an enable level, the fifth switching unit T5 is turned on and the second capacitor C2 is discharged, such that a current flows to the output terminal of the GOA circuit and signal is output at the output terminal of the GOA circuit.

Similar to the first clock signal CLK1 being at an enable level for a prescribed period and the third clock signal CLK3 being at an enable level for a prescribed period have to appear in each operating cycle of the GOA circuit, the fourth clock signal CLK4 for controlling the turning-on of the fifth switching unit T5 has to be at an enable level for a prescribed period in each operating cycle of the GOA circuit, since the turning-on of the fifth switching unit T5 will have a direct influence on the output signal of the GOA circuit.

As compared to the third embodiment, the second capacitor C2 and the fifth switching unit T5 are added in the fourth embodiment, so that the output current of the fourth switching unit T4 can be delayed to meet the actual requirement of output of the GOA circuit. For example, GOA circuits in a certain liquid crystal display have the following input-output rule: the output signal of the GOA circuit corresponding to a current row of pixels is the input signal to the GOA circuit corresponding to a next row of pixels, when the compensation circuit for the threshold voltage drift provided in the third embodiment is adopted by the display, the GOA circuit operates as follows under the control of the compensation circuit: in the compensation circuit for the threshold voltage drift corresponding to the current row of pixels, the fourth switching unit T4 is turned on and the output terminal of the GOA circuit outputs a signal which immediately becomes the input signal to the GOA circuit corresponding to the next row of pixels; if the input-output rule for the GOA circuit of the liquid crystal display is modified as: the output signal of the GOA circuit corresponding to a current row of pixels is the input signal to the GOA circuit corresponding to a following next row of pixels, the compensation circuit for the threshold voltage drift provided in the third embodiment is no longer suitable, when the compensation circuit for the threshold voltage drift provided in the fourth embodiment is adopted, since the second capacitor C2 and the fifth switching unit T5 have a role of delaying the current signal supplied from the fourth switching unit T4, the current signal output when the fourth switching unit T4 in the present embodiment is turned on may be delayed for being used as the input signal to the GOA circuit corresponding to the following next row of pixels, according to the actual requirement in the present fourth embodiment.

Therefore, as compared to the third embodiment, the two devices added in the fourth embodiment allows the compensation circuit for the threshold voltage drift to better control the output terminal to output a signal, thus extending the usage of the compensation circuit for the threshold voltage drift.

Figure 9:
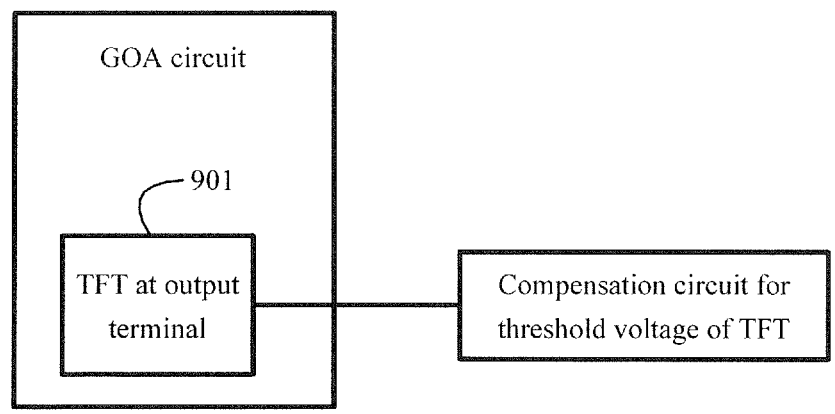
FIG. 9 is a schematic structural diagram of a GOA circuit of the embodiments of the present disclosure.

Accordingly, according to the present disclosure, there is further provided a GOA circuit for driving a row of pixels on an array substrate. As shown in FIG. 9, the GOA circuit includes a thin film transistor 901 at an output terminal for controlling the output terminal of the GOA circuit to output a signal.

Wherein the thin film transistor 901 at the output terminal is connected to any one of the compensation circuits for the threshold voltage drift of the thin film transistor provided in the above embodiments, and the voltage difference between a gate and a source of the thin film transistor at the output terminal is equal to the threshold voltage thereof under the control of the compensation circuit.

In the GOA circuit, for the particular operation of the compensation circuit for the threshold voltage drift of the thin film transistor connected to the thin film transistor 901 at the output terminal, please refer to the above described particular operation of the compensation circuit for the threshold voltage drift, and repeated descriptions are omitted herein.

It should be noted that, the connection of the compensation circuit for the threshold voltage drift of the thin film transistor in the GOA circuit is not defined in the present embodiment and should be any connection allowing the voltage difference between the gate and the source of the thin film transistor at the output terminal equal to the threshold voltage thereof Preferably, the compensation circuit for the threshold voltage drift of the thin film transistor can be connected at a location close to the output terminal of the GOA circuit. Taking the GOA circuit shown in FIG. 2 as example, the region marked by a circle in FIG. 2 is a preferred location where the compensation circuit for the threshold voltage drift of the thin film transistor can be connected.

THE FIFTH EMBODIMENT

Figure 1:
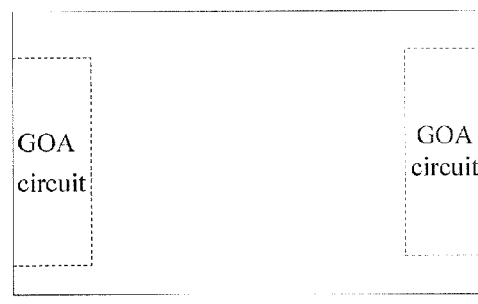
FIG. 1 is a schematic diagram of an existing liquid crystal display panel comprising GOA circuits.
Figure 2:
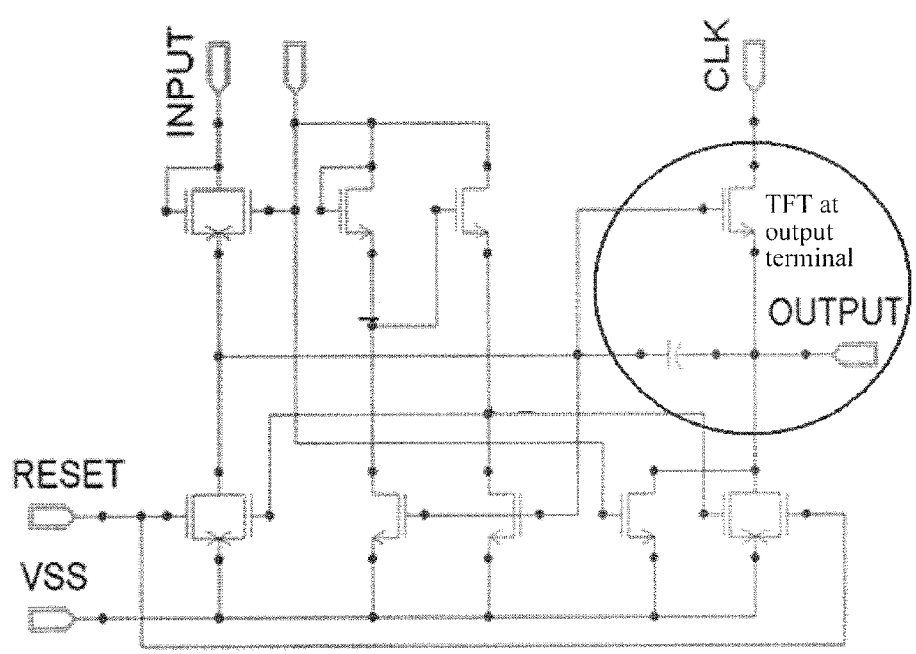
FIG. 2 is a schematic structural diagram of a GOA circuit corresponding to a certain row of pixels on the liquid crystal display panel as shown in FIG. 1.
Figure 3:
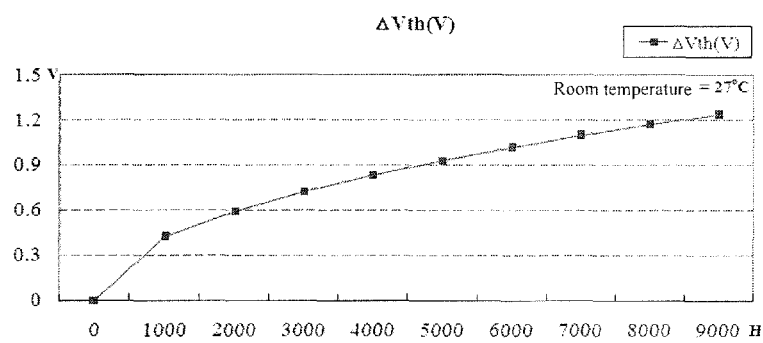
FIG. 3 shows threshold voltage drifts of the thin film transistor at an output terminal of the GOA circuit as shown in FIG. 2.

In the present embodiment, there is provided a GOA circuit which is the GOA circuit shown in FIG. 2 and to which the compensation circuit for the threshold voltage drift of the thin film transistor provided in the third embodiment is connected. The particular configuration of the GOA circuit (hereinafter referred to as the current GOA circuit) and the compensation circuit for the threshold voltage drift of the thin film transistor connected thereto is as shown in FIG. 10, wherein a first electrode of the first capacitor C1 is connected to a gate of the thin film transistor at the output terminal and a second electrode thereof is connected to a drain of the thin film transistor at the output terminal; the first switching unit T1 has a drain connected to the drain of the thin film transistor at the output terminal, a source connected to the source of the thin film transistor at the output terminal; the second switching unit T2 has a source connected to the first electrode of the first capacitor C1; the third switching unit T3 has a source connected to the gate of the thin film transistor at the output terminal; the clock signal received by the gate of the first switching unit T1 is the input signal INPUT to the current GOA circuit, the clock signal received by the gate of the second switching unit T2 is the input signal (N-1)INPUT to a GOA circuit corresponding to a previous row of pixels (that is, a GOA circuit corresponding to a row of pixels previous to the row of pixels to which the current GOA circuit corresponds), the clock signal received by the gates of the third switching unit T3 and the fourth switching unit T4 is the output clock signal CLK of the current GOA circuit (that is, the clock signal shown in FIG. 7(b) for controlling the current GOA circuit to output a signal according to the output timing sequence of the current GOA circuit to meet the actual requirement of the display).

In the present embodiment, the input signal (N-1)INPUT being at an enable level, the input signal INPUT being at an enable level and the output clock signal CLK being at an enable level appear sequentially or alternately, and the input signal INPUT being at an enable level for a prescribed period and the output clock signal CLK being at an enable level for a prescribed period appear in each operating cycle of the current GOA circuit, so as to meet the requirement of the compensation circuit for the threshold voltage drift provided in the embodiment of the present disclosure.

Figure 10:
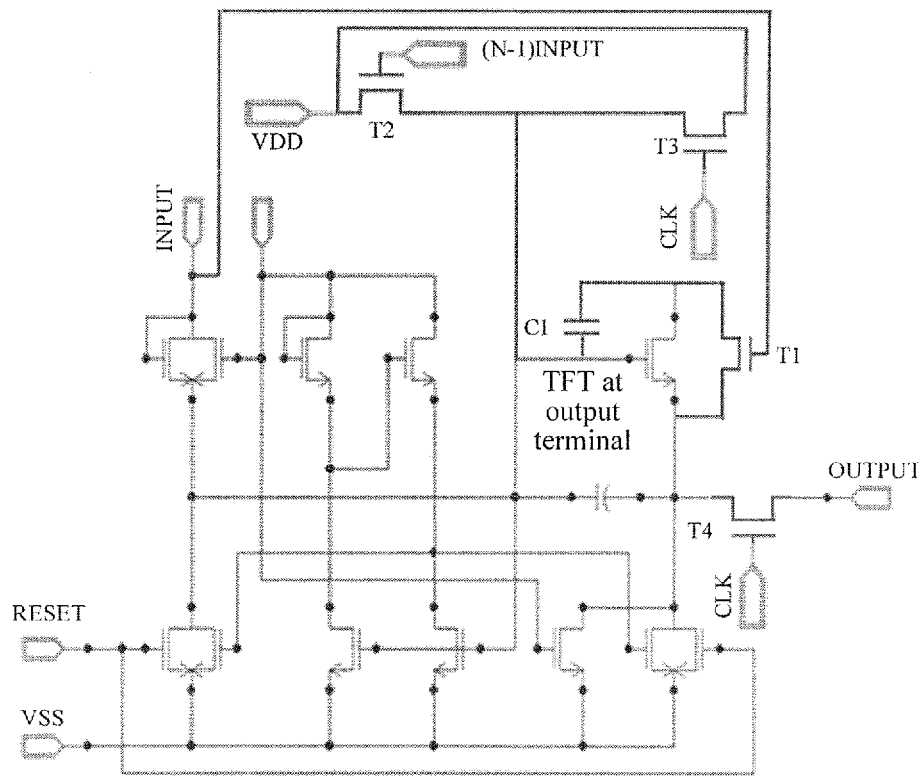
FIG. 10 is a schematic structural diagram of a GOA circuit provided in a fifth embodiment of the present disclosure.
Figure 11:
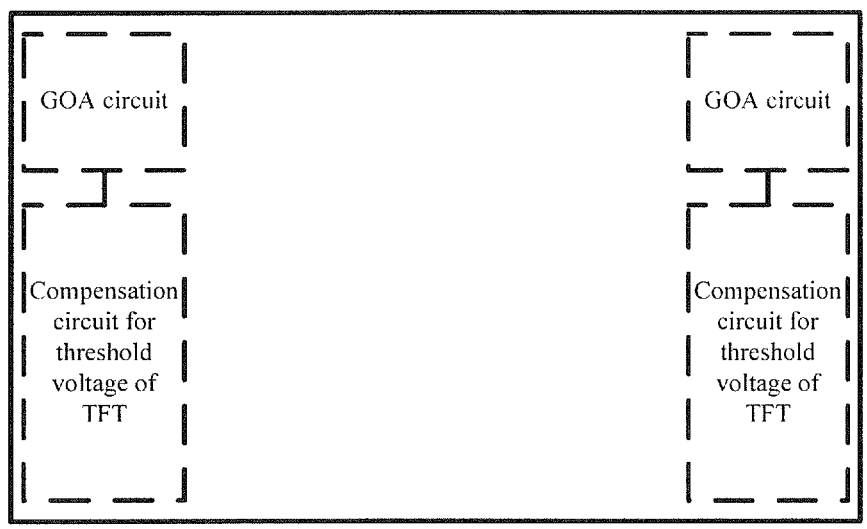
FIG. 11 is a schematic structural diagram of a liquid crystal display of the embodiments of the present disclosure.

Accordingly, in another embodiment, there is provided a liquid crystal display including the GOA circuit as shown in FIG. 10, as shown in FIG. 11.

For the particular operation of the GOA circuit included in the liquid crystal display, please refer to the particular operation of the GOA circuit as shown in FIG. 10 and the above described particular operation of the various compensation circuits for the threshold voltage drift, and repeated descriptions are omitted herein.

The above descriptions are only for illustrating the embodiments of the present disclosure, and in no way limit the scope of the present disclosure. It will be obvious that those skilled in the art may make modifications, variations and equivalences to the above embodiments without departing the spirit and scope of the present disclosure as defined by the following claims. Such variations and modifications are intended to be included within the spirit and scope of the present disclosure.

What is claimed is:

1. A method for compensating a threshold voltage drift of a thin film transistor comprising:
   controlling a drain and a gate of the thin film transistor to have a same voltage; and
   keeping the voltage at the gate of the thin film transistor unchanged and controlling the voltage at the drain of the thin film transistor to be equal to a voltage at a source of the thin film transistor.

2. The method for compensating the threshold voltage drift of the thin film transistor of claim 1, wherein the drain of the thin film transistor is connected to a first electrode of a first capacitor, the gate of the thin film transistor is connected to a second electrode of the first capacitor, and a first switching unit is connected between the drain and the source of the thin film transistor;
   wherein said controlling the drain and the gate of the thin film transistor to have a same voltage comprises: applying a charging signal to the first electrode of the first capacitor, and controlling the first switching unit to be in an OFF state by a first clock signal;
   wherein said keeping the voltage at the gate of the thin film transistor unchanged and controlling the voltage at the drain of the thin film transistor to be equal to the voltage at the source of the thin film transistor comprises: removing the charging signal, and controlling the first switching unit to be in an ON state by the first clock signal such that the source and the drain of the thin film transistor are connected.

3. The method for compensating the threshold voltage drift of the thin film transistor of claim 2, wherein a second switching unit is connected between the first electrode of the first capacitor and a first power supply;
   wherein said applying the charging signal to the first electrode of the first capacitor comprises: controlling the second switching unit to be in an ON state by a second clock signal such that the first power supply applies the charging signal to the first electrode of the first capacitor; and
   wherein removing the charging signal comprises: controlling the second switching unit to be in an OFF state by the second clock signal.

4. The method for compensating the threshold voltage drift of the thin film transistor of claim 3, further comprising:
   applying a control signal to the gate of the thin film transistor, controlling the first switching unit in an OFF state by the first clock signal, and controlling the second switching unit to be in an OFF state by the second clock signal.

5. The method for compensating the threshold voltage drift of the thin film transistor of claim 4, wherein a third switching unit is connected between the gate of the thin film transistor and a second power supply;
   wherein said applying the control signal to the gate of the thin film transistor comprises: controlling the third switching unit to be in an ON state by a third clock signal such that the second power supply applies the control signal to the gate of the thin film transistor.

6. The method for compensating the threshold voltage drift of the thin film transistor of claim 5, further comprising:
   outputting a driving signal at the source of the thin film transistor, controlling the first switching unit to be in an OFF state by the first clock signal, and controlling the second switching unit to be in an OFF state by the second clock signal.

7. The method for compensating the threshold voltage drift of the thin film transistor of claim 6, wherein a fourth switching unit is connected between the source of the thin film transistor and an output terminal;
   wherein said outputting the driving signal at the source of the thin film transistor comprises: controlling the fourth switching unit to be in an ON state by the third clock signal so as to output the driving signal from the output terminal.

8. The method for compensating the threshold voltage drift of the thin film transistor of claim 6, wherein a fourth switching unit and a fifth switching unit are connected in series between the source of the thin film transistor and an output terminal, a first electrode of a second capacitor is connected to a connection point between the fourth switching unit and the fifth switching unit, and a second electrode of the second capacitor is grounded;
   wherein said outputting the driving signal at the source of the thin film transistor comprises: controlling the fourth switching unit to be in an ON state by the third clock signal and controlling the fifth switching unit to be in an OFF state by the fourth clock signal; and controlling the fourth switching unit to be in an OFF state by the third clock signal and controlling the fifth switching unit to be in an ON state by the fourth clock signal, so as to output the driving signal from the output terminal.

9. The method for compensating the threshold voltage drift of the thin film transistor of claim 3, wherein the first switching unit is a first switching transistor, the second switching unit is a second switching transistor;
   a gate of the first switching transistor is connected to the first clock signal, a drain of the first switching transistor is connected to the drain of the thin film transistor, and a source of the first switching transistor is connected to the source of the thin film transistor; and
   a gate of the second switching transistor is connected to the second clock signal, a drain of the second switching transistor is connected to the first power supply, and a source of the second switching transistor is connected to the gate of the thin film transistor and the first electrode of the first capacitor.

10. The method for compensating the threshold voltage drift of the thin film transistor of claim 5, wherein the third switching unit is a third switching transistor;
   a gate of the third switching transistor is connected to the third clock signal, a drain of the third switching transistor is connected to the second power supply, and a source of the third switching transistor is connected to the gate of the thin film transistor and the first electrode of the first capacitor.

11. The method for compensating the threshold voltage drift of the thin film transistor of claim 7, wherein the fourth switching unit is a fourth switching transistor;
   a gate of the fourth switching transistor is connected to the third clock signal, a drain of the fourth switching transistor is connected to the source of the thin film transistor, and a source of the fourth switching transistor is connected to the output terminal.

12. The method for compensating the threshold voltage drift of the thin film transistor of claim 8, wherein the fourth switching unit is a fourth switching transistor and the fifth switching unit is a fifth switching transistor;
   a gate of the fourth switching transistor is connected to the third clock signal, a drain of the fourth switching transistor is connected to the source of the thin film transistor, and a source of the fourth switching transistor is connected to a drain of the fifth switching transistor;
   a gate of the fifth switching transistor is connected to a fourth clock signal, a drain of the fifth switching transistor is connected to the source of the fourth switching transistor, and a source of the fifth switching transistor is connected to the output terminal.

13. The method for compensating the threshold voltage drift of the thin film transistor of claim 6, wherein the second clock signal, the first clock signal and the third clock signal are at an enable level sequentially.

14. The method for compensating the threshold voltage drift of the thin film transistor of claim 13, wherein the thin film transistor is a thin film transistor located at an output terminal of each of a plurality of cascaded shift register units in a gate driving circuit,
   wherein the first clock signal is an enable input signal for a shift register unit at a present stage, the second clock signal is an enable input signal for a shift register unit at a previous stage, and the third clock signal is a clock signal for the gate driving circuit.

* * * * *